(12) United States Patent
Ohmori

(10) Patent No.: US 6,920,065 B2
(45) Date of Patent: Jul. 19, 2005

(54) MAGNETIC STORAGE ELEMENT, RECORDING METHOD USING THE SAME, AND MAGNETIC STORAGE DEVICE

(75) Inventor: Hiroyuki Ohmori, Kanagawa (JP)

(73) Assignee: Sony Corporation, Tokyo (JP)

(*) Notice: Subject to any disclaimer, the term of this patent is extended or adjusted under 35 U.S.C. 154(b) by 55 days.

(21) Appl. No.: 10/713,885

(22) Filed: Nov. 14, 2003

(65) Prior Publication Data

US 2004/0136235 A1 Jul. 15, 2004

(30) Foreign Application Priority Data

Nov. 18, 2002 (JP) .................................... P2002-333801

(51) Int. Cl.⁷ .............................................. G11C 11/15
(52) U.S. Cl. ..................... 365/173; 365/171; 365/225.5
(58) Field of Search ................................ 365/173, 171, 365/225.5, 158

(56) References Cited

U.S. PATENT DOCUMENTS 5,841,692 A * 11/1998 Gallagher et al. .......... 365/173
6,469,926 B1 * 10/2002 Chen .......................... 365/158
6,643,168 B2 * 11/2003 Okazawa .................... 365/173
6,683,815 B1 * 1/2004 Chen et al. ............... 365/225.5
6,765,821 B2 * 7/2004 Saito et al. ................. 365/158

* cited by examiner

Primary Examiner—Anh Phung
(74) Attorney, Agent, or Firm—Sonnenschein, Nath & Rosenthal LLP

(57) ABSTRACT

A magnetic storage element capable of recording with a small magnetic field and retaining information stably and a recording method thereof, and a magnetic storage device having the magnetic storage element and capable of simplifying a drive circuit thereof are provided. The magnetic storage element comprises a storage layer, a non-magnetic layer and a pinned layer. The storage layer is composed of directly stacked first magnetic layer mainly composed of a transition metal and second magnetic layer mainly composed of a rare-earth metal; and a magnetization amount of the first magnetic layer is smaller than that of the second magnetic layer at a room temperature. A magnetization state of one direction is recorded by heating and applying a magnetic field to the storage layer, and a magnetization state of the other direction is recorded by making magnetic coupling work between the first magnetic layer and the pinned layer by heating.

6 Claims, 10 Drawing Sheets

CURRENT TO RESISTANCE HEATER

CURRENT TO STORAGE LAYER

"0" RECORDING    "1" RECORDING

MAGNETIC STORAGE ELEMENT, RECORDING METHOD USING THE SAME, AND MAGNETIC STORAGE DEVICE

CROSS REFERENCES TO RELATED APPLICATIONS

The present document is based on Japanese Priority Document JP 2002-333801, filed in the Japanese Patent Office on Nov. 18, 2002, the entire contents of which being incorporated herein by reference.

BACKGROUND OF THE INVENTION

1. Field of the Invention

The present invention relates to a magnetic storage element preferably applicable to a non-volatile memory, a recording method using the same, and a magnetic storage device using the magnetic storage element.

2. Description of Related Art

In information apparatuses such as computers, a DRAM which is operable at a high speed and having a large storage density is widely used as random access memories therefor. A DRAM is however classified as a volatile memory which cannot keep information when the power supply is interrupted, so that there is a demand for non-volatile memory which can keep information at any time.

One example of the non-volatile memory relates to a magnetic random access memory (MRAM) which uses magnetic storage elements capable of recording information based on a magnetization state of a magnetic material (see non-patent document 1, for example).

[Non-patent Document 1]
Nikkei Electronics, Feb. 12, 2001 (pp. 164–171)

SUMMARY OF THE INVENTION

Because trends for the future require for the MRAM to further raise density for a larger storage capacity, and to reduce size of the magnetic storage element composing the memory cells thereof.

The magnetic storage element used for the MRAM utilizes a demagnetizing field generated by having the magnetic material being rectangular or oval to stabilize a magnetization state. The magnetic material, however, tends to increase its coercive force as the size thereof is reduced, and this inevitably raises a coercive force also in the magnetic storage elements used for the MRAM with progress of the size reduction.

Depending on the increase of the coercive force along with the reduction in size of the magnetic storage element, a further larger magnetic field is required to be applied at the time of recording. In the MRAM, an electric current (recording current) applied to a word line and a bit line generates a magnetic field to record on the magnetic storage element and there is required a large amount of recording current. Accordingly, when a recording capacity of the MRAM is enlarged by having a large number of elements by reducing the size of the magnetic storage element, an amount of the consumption electric current of the MRAM is increased. Therefore, in order to increase the storage capacity of the MRAM, it is desired that the coercive force of the magnetic storage element is reduced to reduce the amount of recording current.

On the other hand, when the magnetic storage element is reduced in size, a coercive force to some extent large is required to stably hold recorded information. Therefore, in the case of reducing the magnetic storage element in size, it is necessary to satisfy conflicting conditions, one for reducing the coercive force to reduce the recording current and the other for having a coercive force to some extent to stably hold the recorded information.

Furthermore, in the MRAM, using the magnetic field generated from the electric current applied to the word line and the bit line, information is recorded by changing a direction of the magnetization of the storage layer of the magnetic storage element in accordance with a direction of the generated magnetic field. Accordingly, in order to change the direction of the magnetization of the storage layer, it is necessary to change the direction of the electric current. In view of this, since the number of combinations of the electrical potential supplied to both ends of the word line and the bit line becomes large and a drive circuit becomes complicated, this brings an obstruction for having a higher storage density.

In order to solve these conventional problems, in the present invention, there are provided a magnetic storage element capable of recording with a small magnetic field and of stably holding information and a recording method thereof, and a magnetic storage device having the magnetic storage element and capable of recording with a small amount of a recording current and of stably storing the information and capable of simplifying a drive circuit thereof.

The magnetic storage element of the present invention comprises a storage layer for holding a magnetization state as information, a non-magnetic layer, and a pinned layer in which a direction of the magnetization is fixed. The storage layer is constituted by directly stacking a first magnetic layer mainly composed of a transition metal and a second magnetic layer mainly composed of a rare-earth metal, and at the room temperature, an amount of magnetization of the first magnetic layer is smaller than that of the second magnetic layer.

In addition, in the magnetic storage element of the present invention, it may be arranged so that the first magnetic layer among the first and second magnetic layers constituting the storage layer is disposed nearer to the pinned layer.

A recording method according to the present invention is used for a magnetic recording element comprising: a storage layer for holding a magnetization state as information, a non-magnetic layer and a pinned layer in which a direction of the magnetization is fixed, which are stacked, the storage layer is composed of a first magnetic layer mainly composed of a transition metal and a second magnetic layer mainly composed of a rare-earth metal which are directly stacked, in which a magnetization amount of the first magnetic layer is smaller than a magnetization amount of the second magnetic layer at a room temperature, wherein recording is carried out by heating the storage layer and applying a magnetic field to the magnetic layer so as to record a magnetization state in a single direction on the magnetic layer, and by heating the storage layer to have a magnetic coupling work on the first magnetic layer and the pinned layer so as to record a magnetization state in the other direction on the storage layer.

A magnetic storage device the present invention comprises: a magnetic storage element which comprises a storage layer for holding a magnetization state as information, a non-magnetic layer and a pinned layer in which a direction of the magnetization is fixed, which are stacked, in which the storage layer is composed of a first magnetic layer mainly composed of a transition metal and a second magnetic layer mainly composed of a rare-earth metal which are directly stacked, and a magnetization amount of the first magnetic layer is smaller than a magnetization amount of the second magnetic layer at a room temperature; a reader for reading out a relative magnetization between the storage layer and the pinned layer depending on a change of a electrical resistance, a wiring for applying a current induced magnetic field in one direction to the storage layer, and a heater for heating the storage layer.

In addition, in the magnetic storage apparatus of the present invention, the wiring may be electrically connected to the storage layer and may also function as a heater. Furthermore, in the magnetic storage apparatus of the present invention, in addition to the above-mentioned wiring, a second wiring may be provided so that the wiring and the second wiring function as the heater.

According to the structure of the above-described magnetic storage element of the present invention, since the storage layer is composed of the first magnetic layer mainly composed of a transition metal and the second magnetic layer mainly composed of a rare-earth metal which are directly stacked, the magnetization amount of the first magnetic layer is smaller than that of the second magnetic layer at the room temperature, a direction of the magnetization of the whole storage layer becomes the same as the direction of the magnetization of the second magnetic layer at the room temperature. As the storage layer is heated and the temperature rises, the magnetization of the second magnetic layer becomes smaller and the magnetization of the whole storage layer also becomes small. Therefore, it is possible to carry out recording by changing the magnetization of the storage layer using a smaller magnetic field. In addition, since the storage layer, the non-magnetic layer and the pinned layer are stacked to constitute the magnetic storage element, it is possible to generate a magnetic coupling between the pinned layer and the first magnetic layer mainly composed of the transition metal of the storage layer and to align the directions of the magnetization of the pinned layer and the magnetization of the first magnetic layer to be the same, that is, in parallel. When the storage layer is further heated to a higher temperature to further reduce the magnetization of the second magnetic layer mainly composed of the rare-earth metal. This results in that the whole storage layer has very few magnetization or an extremely small magnetization so that the magnetic coupling is made effective. Accordingly, even if the magnetic field is not applied to the storage layer, it is possible to align the directions of the magnetization of the pinned layer and the magnetization of the first magnetic layer to be the same (in parallel) and to make these directions be in anti-parallel at the room temperature.

In addition, in the above magnetic storage element of the present invention, when the first magnetic layer among the first magnetic layer and the second magnetic layer constituting the storage layer is disposed nearer to the pinned layer, since the first magnetic layer mainly composed of the transition metal is disposed nearer to the pinned layer, it is possible to strengthen the interaction between the first magnetic layer and the pinned layer usually composed of a transition metal and an electric current easily flows through the non-magnetic layer disposed between them so that reading of the magnetization state of the storage layer can be performed easily.

According to the above recording method of a magnetic storage element of the present invention, by heating the storage layer and applying the magnetic field to the storage layer of the magnetic storage element of the present invention, a magnetization state of one direction is recorded on the storage layer, and by heating the storage layer to have a magnetic coupling function on the first magnetic layer and the pinned layer so as to record a magnetization state in the other direction on the storage layer, and when the magnetization state of the other direction is recorded on the storage layer, it is possible to carry out recording owing to actions of the heating and the magnetic coupling without applying the magnetic field to the storage layer. Accordingly, the magnetic field applied to the storage layer can be fixed to the one having one direction which makes the magnetization state of the storage layer in the direction.

According to the structure of the magnetic storage device of the present invention, since it comprises the above magnetic storage element of the present invention, the reader for reading out a relative magnetization between the storage layer and the pinned layer depending on a change of a electrical resistance, the wiring for applying a current induced magnetic field in one direction to the storage layer, the heater for heating the storage layer, it is possible to record on the magnetic storage element in accordance with the above-described recording method. That is, it is possible to record the magnetization state in the one direction on the storage layer by heating the storage layer by the heater and applying the current induced magnetic field of the one direction by making it flow through the wiring. In addition, by heating the storage layer by the heater and making the magnetic coupling effective on the first magnetic layer and the pinned layer, it is possible to record the magnetization state of the other direction on the storage layer without making the electric current flow through the wiring for applying the current induced magnetic field.

Furthermore, in the case of the magnetic storage apparatus of the present invention having the wiring electrically connected to the storage layer for also functioning as the heater, the electric current flows from the wiring to the storage layer so that the current induced magnetic field effectively works on the storage layer. In addition, it becomes easy to carry out heating and application of the magnetic field simultaneously. In addition, in the magnetic storage apparatus of the present invention, in the case of having the second wiring in addition to the original wiring and constituting the heater with these wirings, it is possible to perform recording by selecting arbitrary magnetic storage element by selecting the wiring. Furthermore, since the heater comprises two kinds of wirings, depending on a combination of the electric currents to be supplied to these wiring, the heating condition can be changed so that the magnetization state recorded on the storage layer can also be changed.

According to the present invention described above, it becomes possible to record on the storage layer with a smaller magnetic field owing to the heating than at the room temperature. In addition, at the room temperature, the magnetization of a storage layer becomes larger and so the coercive force thereof than when it is heated so that recorded information is stably retained. Furthermore, by heating the storage layer to make its temperature higher so that the magnetic coupling works between the pinned layer and the first magnetic layer, by only heating the storage layer, even without applying the magnetic field to the storage layer, it becomes possible to record the magnetization state having one direction on the storage layer. Therefore, only at the time of recording the magnetization state of the other direction on the storage layer, the magnetic field is to be applied to the storage layer and the magnetic field to be applied to the storage layer can have only one direction. Accordingly, the structure of the means for applying the magnetic field to the storage layer can be simplified.

Furthermore, according to the magnetic storage device of the present invention, since the electric current is supplied through the wiring for applying the current induced magnetic field to the storage layer of the magnetic storage element and the magnetization state of one direction can be recorded on the storage layer, and also, even without supplying the electric current to the wiring, the magnetization state of the other direction can be recorded on the storage layer, the electric current should have one direction only. Accordingly, in comparative of the case of flowing the electric current through the wiring in both directions, the number of combinations of electrical potential supplied to both ends of the wiring can be reduced and the drive circuit for supplying the electric current to the wiring can be simplified. Accordingly, it becomes possible to simplify the structure of the magnetic storage device and to realize high density easily.

In particular, in the case of the magnetic storage apparatus of the present invention having the wiring electrically connected to the storage layer for also functioning as heater, the current induced magnetic field effectively works on the storage layer so that recording with smaller electric current is made possible. In addition, in the case of having the second wiring in addition to the original wiring and constituting the heater with these wirings, it is possible to perform recording selecting arbitrary magnetic storage element by selecting the wiring.

BRIEF DESCRIPTION OF THE DRAWINGS

FIG. 7 is a view showing a measurement result of relationship between strength of a magnetic field applied to the magnetic tunnel junction element of FIG. 2 and a tunnel resistance, in which

FIG. 11 is a schematic structural view showing a magnetic storage element according to another embodiment of the present invention; in which

DESCRIPTION OF THE PREFERRED EMBODIMENTS

Before explaining a specific embodiment, a brief summary of the present invention will be described. In the present invention, a magnetic storage element in which a first magnetic layer mainly composed of a transition metal and a second magnetic layer mainly composed of a rare-earth metal are directly stacked as a storage layer holding a record by a direction of magnetization is constituted. Furthermore, with regard to the storage layer, a pinned layer is disposed having a non-magnetic layer (a tunnel insulating layer or a non-metal layer, for example) therebetween.

Figure 3A:
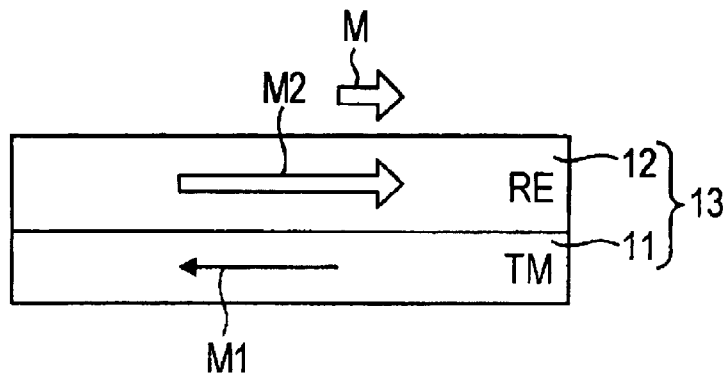
FIG. 3A to FIG. 3D are views showing changes of a magnetization state of the storage layer of the magnetic storage element of the present invention in accordance with temperature change.

That is, in the magnetic storage element of the present invention, a storage layer 13 is constituted by directly stacking a first magnetic layer 11 and a second magnetic layer 12. The first magnetic layer 11 is mainly composed of a transition metal (TM) and the second magnetic layer 12 is mainly composed of a rare-earth metal (RE). These first magnetic layer 11 and second magnetic layer 12 are directly stacked so that a direction of a magnetic moment (magnetization) M1 of the transition metal (TM) of the first magnetic layer 11 and a direction of a magnetic moment (magnetization) M2 of the rear-earth metal (RE) of the second magnetic layer 12 are coupled to oppose to each other, that is, to be in anti-parallel. At a room temperature, the directions of the magnetization are as shown in FIG. 3A. In addition, in the present invention, at the room temperature, it is arranged so that an amount of the magnetization M1 of the first magnetic layer 11 is less than an amount of the magnetization M2 of the second magnetic layer 12, that is, M1<M2 is satisfied. Therefore, at the room temperature, a magnetization M of the whole storage layer 13 has a direction the same as that of the magnetization M2 of the second magnetic layer 12.

Figure 3B:
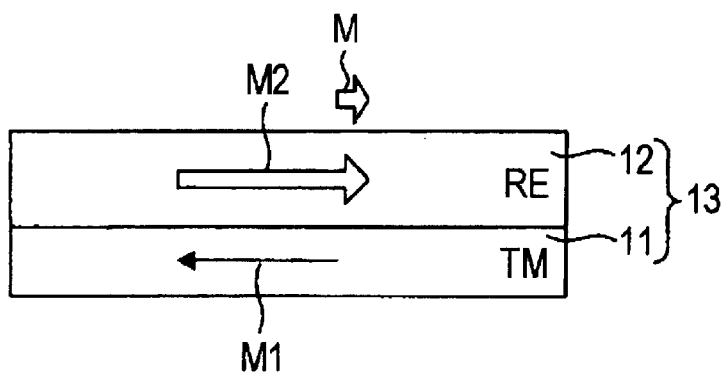
Figure 3C:
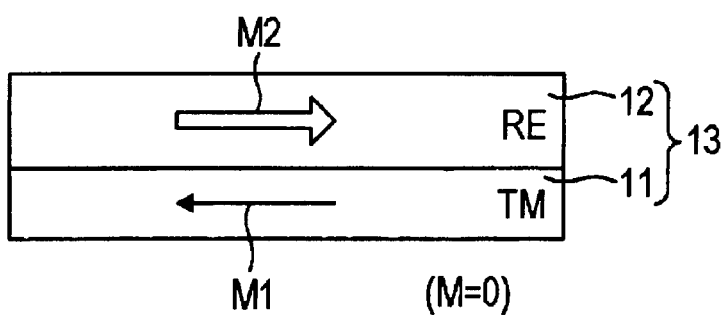
Figure 3D:
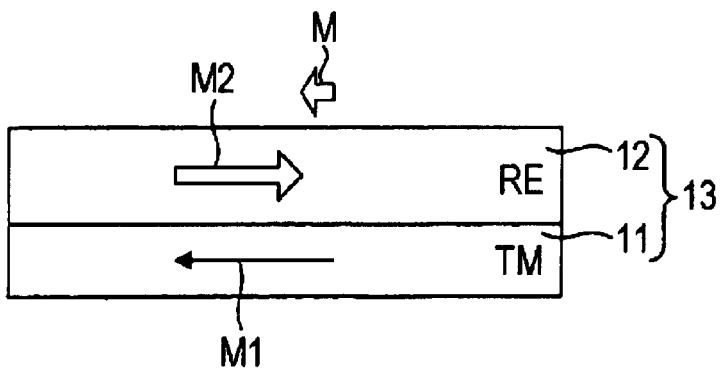

The amount of the magnetization M1 of the transition metal (TM) of the first magnetic layer 11 is less affected by temperature change. However, the amount of the magnetization M2 if the rare-earth metal of the second magnetic layer 12 decreases as the temperature rises. Therefore, when heating the storage layer 13 of this structure to have a higher temperature, the magnetization M2 of the rare-earth metal of the second magnetic layer 12 (RE) becomes smaller as shown in FIG. 3B. Accordingly, the magnetization M of the whole storage layer 13 becomes smaller than that at the room temperature. When heating further to raise the temperature, as shown in FIG. 3C, the magnetization M2 of the rare-earth metal (RE) of the second magnetic layer 12 becomes further smaller to be almost equal to the magnetization M1 of the transition metal (TM) of the first magnetic layer 11, that is, M1=M2 is mostly satisfied. Accordingly, the magnetization M of the whole storage layer 13 becomes almost zero (0). When heating further to raise the temperature more, as shown in FIG. 3D, the magnetization M2 of the rare-earth metal (RE) of the second magnetic layer 12 becomes further smaller to be smaller than the magnetization M1 of the transition metal (TM) of the first magnetic layer 11, that is, M1>M2 is satisfied. Accordingly, the direction of the magnetization M of the whole storage layer 13 becomes the same as that of the magnetization M1 of the transition metal (TM) of the first magnetic layer 11 and, thus, becomes a reverse direction from the direction at the room temperature.

It is noted that when the magnetization M1 of the first magnetic layer 11 is larger than the magnetization M2 of the second magnetization layer, that is, M1>M2 is satisfied, the amount of the magnetization M of the whole storage layer 13 increases as the temperature rise by heating. This makes it impossible to reduce the coercive force of the storage layer 13 even if it is heated and is unfavorable.

In the each state shown in FIG. 3B to FIG. 3D, in comparative of the state at the room temperature shown in FIG. 3A, the magnetization M of the whole storage layer 13 is extremely small so that the coercive force of the whole storage layer 13 is also small. In the state that the magnetization M of the whole storage layer 13 becomes zero (0) or in a state that the magnetization M of the whole storage layer 13 becomes extremely smaller than the states shown in FIG. 3B or FIG. 3D, there remain few magnetic anisotropy depending on the shape and influence on the magnetic field from outside, and influence such as a magnetic interaction between layers, for example, largely affects on the whole storage layer 13. Therefore, the coercive force of the whole storage layer 13 is small, but the size of the magnetic field required for controlling the direction of magnetization does not become small.

Figure 4A:
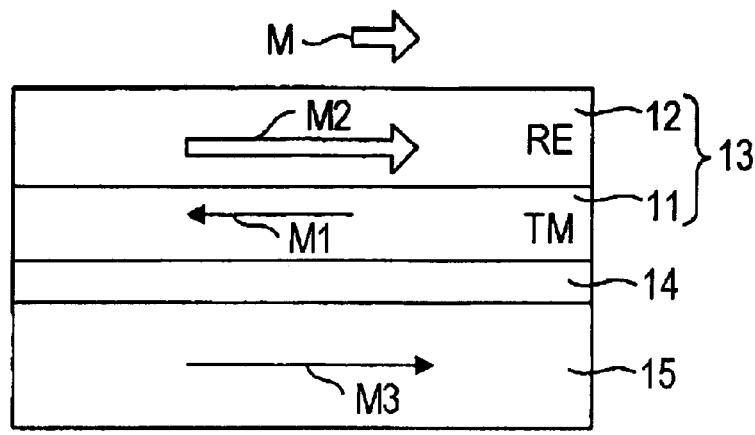
FIG. 4A to FIG. 4C are views explaining recording operations on the magnetic storage element.

In view of this, in addition to the storage layer 13 of the above-described structure, as shown in FIG. 4A, a pinned layer 15 is disposed having a tunnel insulating film 14 or another non-magnetic layer therebetween to constitute the magnetic storage element. And in the state that the magnetization M of the whole storage layer 13 becomes almost zero (0)as shown in FIG. 3C or in a similar state, that is, the state that the magnetization M of the whole storage layer 13 is sufficiently small, a magnetic coupling by the magnetic interaction is generated between the pinned layer 15 and the storage layer 13. Owing to the magnetic coupling, it is possible to make the direction of the magnetization M1 of the transition metal (TM) of the first magnetic layer 11 the same as, that is, in parallel with that of a magnetization M3 of the pinned layer 15. When the magnetic storage element of this state is cooled, the direction of the magnetization M1 of the first magnetic layer becomes parallel to that of the magnetization M3 of the pinned layer 15, the direction of the magnetization M2 of the second magnetic layer 12 becomes anti-parallel to those of the magnetization M1 of the first magnetic layer and the magnetization M3 of the pinned layer 15, as shown in FIG. 4C, so that the magnetization M of the whole storage layer 13 becomes anti-parallel to the magnetization M3 of the pinned layer 15.

Figure 5A:
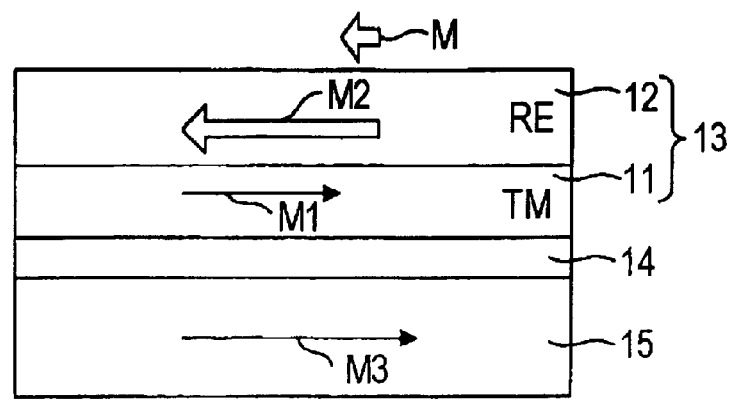
FIG. 5A and FIG. 5B are also views explaining recording operations on the magnetic storage element of the present invention.
Figure 5B:
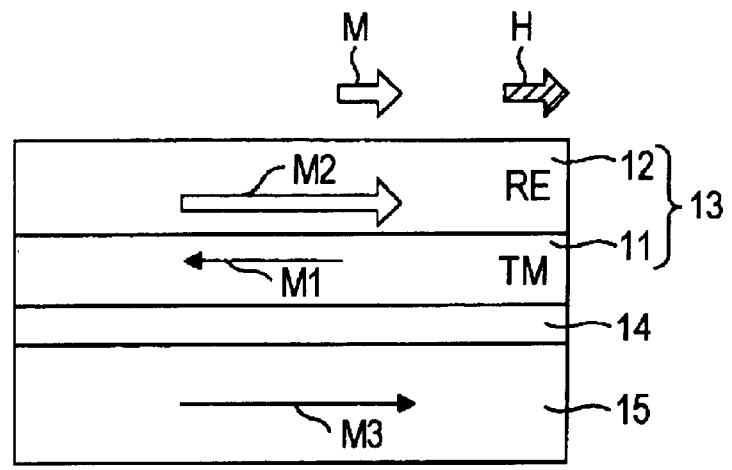

In order to record information, it is also necessary to make the direction of the magnetization M of the whole storage layer 13 be in parallel to the direction of the magnetization M3 of the pinned layer, that is, to make the direction of the magnetization M1 of the first magnetic layer 11 of the storage layer 13 be in anti-parallel to the direction of the magnetization 3 of the pinned layer 15. For example, as shown in FIG. 5A, under a condition that the magnetization M of the whole storage layer 13 after temperature rise becomes smaller than that at the room temperature, as shown in FIG. 5B, a magnetic field H having a same direction as the magnetization M3 of the pinned layer may be applied to realize the above state. The magnetic field H is capable of inverting the direction of the magnetization M of the whole storage layer 13 to be the same as the magnetic field H. However, if the magnetization M of the whole storage layer 13 becomes too small, the storage layer 13 is hardly affected by the magnetic field H as described above, it is necessary to keep the temperature not to be high. Recording in this way enables information recording by changing the direction of the magnetization M of the storage layer 13 parallel or anti-parallel to the magnetization M3 of the pinned layer 15 by use of the magnetic field having a single direction only.

Figure 1:
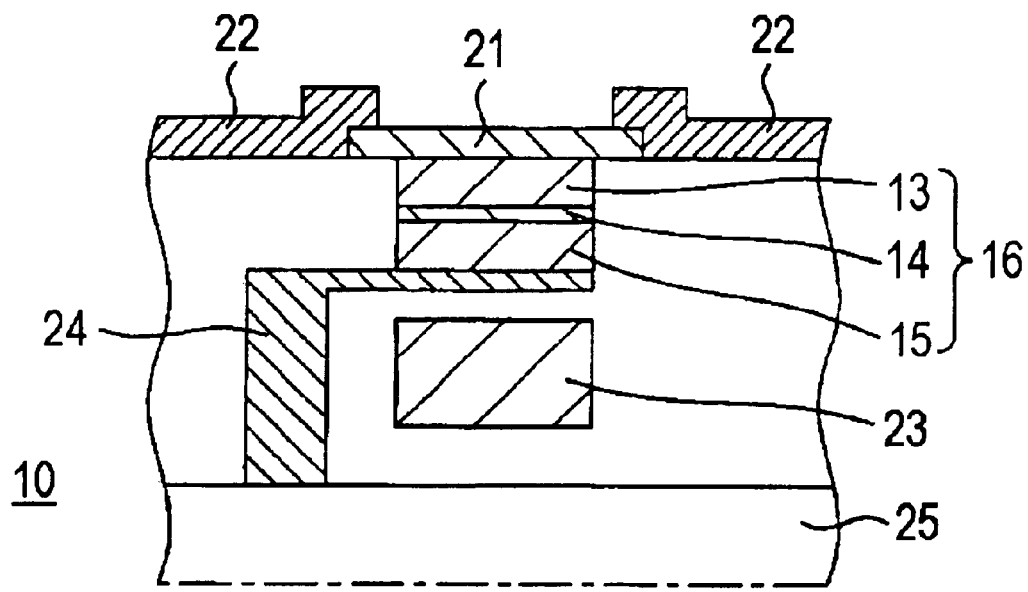
FIG. 1 is a schematic drawing showing a magnetic storage element according to one embodiment of the present invention.

Next, specific embodiments of the present invention will be described. A schematic drawing showing a magnetic storage element according to another embodiment of the present invention is shown in FIG. 1. This magnetic storage element 10 comprises the storage layer 13 and the pinned layer 15 structured as described above being disposed having the tunnel insulating layer 14 therebetween to form a magnetic tunnel junction element (MTJ) 16. In the magnetic tunnel junction element (MTJ) 16, it is arranged that the horizontal direction in the figure is a direction of an easy axis of magnetization of the magnetic layer and that the vertical direction in the figure is a direction of a hard axis of magnetization of the magnetic layer. In addition, as a heater for heating the storage layer 13, a resistance heater 21 is disposed on the storage layer 13. The resistance heater 21 applies an electric current to the first wiring connected to both ends thereof to generate heat. The first wiring 22 extends in the horizontal direction in the figure to be in parallel to the direction of the easy axis of magnetization of the magnetic layer of the magnetic tunnel junction element 16. Under the magnetic tunnel junction element 16, the second wiring 23 extending in the vertical direction in the figure (the direction of the hard axis of magnetization of the magnetic layer of the magnetic tunnel junction element), and the second wiring 23 applies a magnetic field of a rightward direction or a leftward direction in the figure which corresponds to the easy axis of magnetization of the magnetic layer of the magnetic tunnel junction element 16. Under the pinned layer 15, the third wiring 24 for detecting magnetization is connected. In the figure, a reference numeral 25 shows a substrate on which a transistor and the like are mounted.

Figure 2:
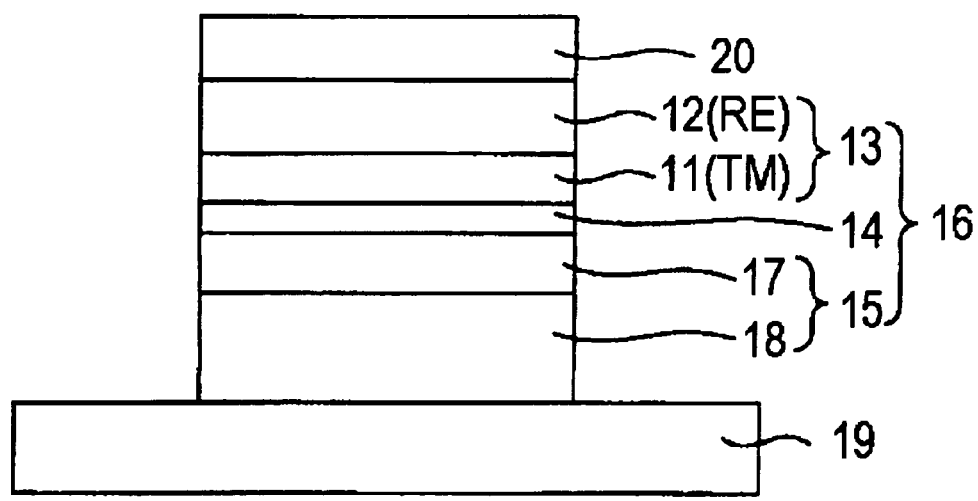
FIG. 2 is a detailed cross sectional view showing the vicinity of a magnetic tunnel junction element of FIG. 1.

Furthermore, in the magnetic storage element 10 of FIG. 1, a detailed cross sectional view of the vicinity of the magnetic tunnel junction element 16 is shown in FIG. 2. As shown in FIG. 2, the storage layer 13 has a double-layer structure which comprises the first magnetic layer 11 mainly composed of the transition metal (TM) and the second magnetic layer 12 mainly composed of the rare-earth metal (RE) directly stacked thereon. In addition, similarly to the case of FIG. 3A, at the room temperature, the magnetization of the first magnetic layer 11 is arranged to be smaller than that of the second magnetic layer 12. Furthermore, the first magnetic layer 11 mainly composed of the transition metal (TM) is disposed closer to the pinned layer 15 than the second magnetic layer 12 so that the tunnel electric current through the tunnel insulating film 14 can be increased. The pinned layer 15 comprises a ferromagnetic layer 17 and an anti-ferromagnetic layer 18 to fix a magnetization of the ferromagnetic layer 17 in one direction stacked thereon. A base film 19 under the pinned layer 15 and a protection film 20 on the storage layer 13 are omitted from FIG. 1.

The first magnetic layer 11 of the storage layer 13 may be composed of a transition metal such as CoFe, and the second magnetic film 12 may be composed of a rare-earth metal such as Gd. For example, in a case where the first magnetic layer 11 is a CoFe film having a thickness of 2 nm and the second magnetic layer 12 is a Gd film having a thickness of 5 nm, the magnetization of the second magnetic layer 12 can be larger than that of the first magnetic layer 11. The tunnel insulation film 14 may be an $Al_2O_3$ film having a thickness of 0.8 nm, for example. In addition, the ferromagnetic layer 17 of the pinned layer 15 may be a Co film having a thickness of 2 nm, for example, and the anti-ferromagnetic layer 18 may be a PtMn film having a thickness of 20 nm, for example. The base film 19 may be a Ta film having a thickness of 10 nm, for example, and the protection film 20 may be a Ta film having a thickness of 5 nm, for example.

In the case of the second magnetic layer 12 being the Gd film, since the Curie temperature of the simple Gd is about 300K (about 30° C.), there is a concern that the magnetization of the second magnetic layer 12 disappears because of a usual temperature exceeding the Curie temperature. However, in the present embodiment, since the second magnetic layer 12 is directly stacked on the first magnetic layer 11 composed of the transition metal so that the magnetization thereof is stable and results in rising of the Curie temperature effectively, and the magnetization of the second magnetic layer does not disappear at the usual temperature.

In the magnetic storage element 10 of the present embodiment, flowing the electric current through the first wiring 22 to heat the resistance heater 21 enables heating of the storage layer 13. In addition, making the electric current flow through the second wiring 23 generates the current induced magnetic field and applies the current induced magnetic field to the storage layer 13. The current induced magnetic field controls the direction of the magnetization of the storage layer 13 to be either in parallel to or in anti-parallel to the direction of the pinned layer 15 to record information on the storage layer 13. At the time of recording, by heating the storage layer 13 using the resistance heater 21, the magnetization M of the whole storage layer 13 becomes smaller than that at the room temperature as shown in FIG. 3A and FIG. 3B so that it is possible to record information with a smaller current induced magnetic field.

Even if the magnetic storage element 10 constituted as shown in FIG. 1 is arranged to change the current induced magnetic field by changing the direction of the electric current made flow through the second wiring 23, similarly to a magnetic storage element used in a usual MRAM, it is possible to record information. However, such an arrangement results in a drive circuit for feeding the electric current in both directions through the second wiring 23 being more complicated.

Figure 4B:
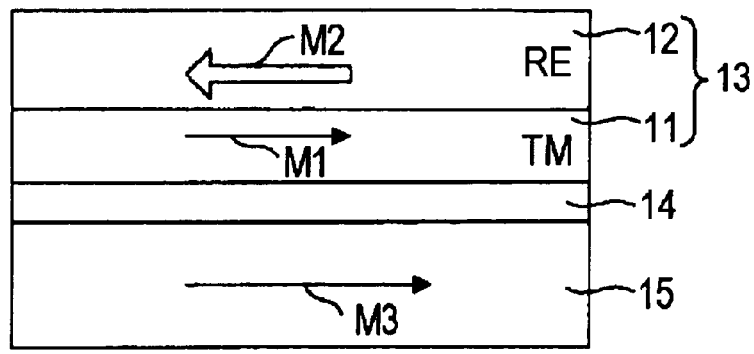
Figure 4C:
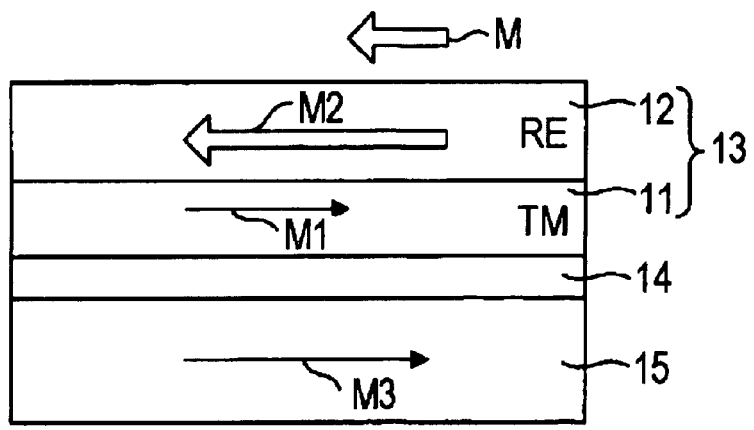

Accordingly, in the present embodiment, in the magnetic storage element 10 constituted as shown in FIG. 1, using the magnetic coupling between the first magnetic layer (transition metal layer) 11 and the pinned layer 15 of the storage layer 13, the direction of the magnetization M1 of the first magnetic layer 11 and the direction of the magnetization M3 of the pinned layer 15 are made in parallel, similarly to that shown in FIG. 4B. Accordingly, when making the directions of the magnetization M1 of the first magnetic layer 11 and the magnetization M3 of the pinned layer 15 in parallel, that is, as shown in FIG. 4C, when making the directions of the magnetization M of the whole storage layer 13 and the magnetization M3 of the pinned layer 15 in anti-parallel, there is no need to apply a magnetic field and no electric current is required to flow through the second wiring 23. Only required is that making the electric current through the first wiring 22 to head the storage layer 13 by the resistance heater 21.

On the other hand, when making the directions of the magnetization M1 of the first magnetic layer 11 and the magnetization M3 of the pinned layer 15 in anti-parallel, that is, when making the directions of the magnetization M of the whole storage layer 13 and the magnetization M3 of the pinned layer 15 in parallel, the electric current is made flow through the first wiring 22 to heat the storage layer 13 by the resistance heater 21 and the electric current is also made flow through the second wiring 23 to apply the current induced magnetic field. At this time, the direction of the electric current made flow through the second wiring 23 is set so that the current induced magnetic field generated from the electric current works in the same direction as the direction of the magnetization M3 of the pinned layer 15 with regard to the storage layer 13. In addition, in order to make the storage layer 13 be affected by the current induced magnetic field, setting the amount of the electric current made flow through the first wiring 22 to control the temperature of the storage layer 13.

In this way, in the present embodiment, it is possible to make the electric current flowing through the second wiring 23 in only one direction at the time of recording. Accordingly, in comparative of the case of flowing the electric current through the second wiring 23 in both directions, the number of combinations of electrical potential supplied to both ends of the second wiring 23 can be reduced and the drive circuit for supplying the electric current to the second wiring 23 can be simplified.

In the magnetic storage element 10 of the present embodiment, detection (reading) of magnetized information recorded on the storage layer 13 can be carried out similarly to the magnetic storage element used in the conventional MRAM. That is, since resistance against the tunnel current flowing through the tunnel insulating film 14 changes depending on whether the directions of the magnetization M of the storage layer 13 and the magnetization M3 of the pinned layer 15 are in parallel (same direction) or in anti-parallel (opposite direction), the magnetized information recorded on the storage layer 13 can be detected from the resistance value or the electric current value.

According to the magnetic storage element 10 of the present embodiment, since it has the storage layer 13 which comprises the first magnetic layer 11 mainly composed of the transition metal and the second magnetic layer 12 mainly composed of the rare-earth metal which are directly stacked and, at the room temperature, the magnetization M2 of the second magnetic layer is larger than the magnetization M1 of the first magnetic layer 11, it is possible to change the magnetization M of the whole storage layer 13 with a relatively small magnetic field by heating the storage layer so as to make the magnetization M of the whole storage layer 13 smaller than that at the room temperature.

Since the storage layer 13 and the pinned layer 15 are disposed having therebetween the tunnel insulation layer 14, if the magnetization M of the whole storage layer 13 is made extremely small by heating the storage layer 13, it is possible to make the directions of the magnetization M1 of the first magnetic layer 11 and the magnetization M3 of the pinned layer 15 be the same without generating the magnetic coupling between the first magnetic layer 11 mainly composed of the transition metal and the pinned layer 15 and applying the magnetic field.

Accordingly, only by generating heat at the resistance heater 21 disposed on the storage layer 13 to heat the storage layer 13, it is possible to make the directions of the magnetization M1 of the first magnetic layer 11 and the magnetization M3 of the pinned layer 15 be the same even without generating the current induced magnetic field from the electric current flowing through the second wiring 23. Therefore, it becomes possible to make the direction of the electric current applying to the second wiring 23 be only the direction generating the current induced magnetic field which makes the directions of the magnetization M1 of the first magnetic layer 11 and the magnetization M3 of the pinned layer 15 oppose to each other, that is, be only one direction, the drive circuit for supplying the electric current to the second wiring 23 can be simplified.

A magnetic storage device such as an MRAM can be constituted by disposing the magnetic storage element 10 of the present embodiment at each of intersections of a plurality of first wirings 22 and second wirings 23 orthogonally arranged to be a matrix pattern.

In a case of constituting the magnetic storage device in this way, if the electric current is supplied in both directions of the second wiring 23 which applies the current induced magnetic field to the storage layer 13 of the magnetic storage element 10, it is possible to select an arbitrary magnetic storage element 10 among a number of magnetic storage elements 10 to record information of "0" or "1" by selecting the first wiring 22 and the second wiring 23 to which the electric current is to be supplied and selecting the direction of the electric current to flow through the second wiring 23.

On the other hand, as described in the above embodiment, when using the magnetic coupling with the pinned layer 15 to set the direction of the electric current to flow through the second wiring 23, in accordance with the above steps, an arbitrary magnetic storage element 10 is selected and it becomes impossible to record arbitrary information of "0" or "1". In such a structure, in order to record arbitrary information, the following method can be employed, for example. Here, it is described that generating of the current induced magnetic field by flowing the electric current through the second wiring 23 records the information of "0", and generating of the magnetic coupling with the pinned layer 15 records the information of "1". In order to record the information of "0", the electric current is supplied to a first wiring 22 and a second wiring 23 corresponding to a target magnetic storage element 10. At this time, the amount of the electric current to be supplied to the first wiring 22 is relatively small. Accordingly, only the target magnetic storage element 10 is heated and applied with the current induced magnetic field so that the information of "0" is recorded. In a magnetic storage element 10 only heated or a magnetic storage element 10 only applied with the current induced magnetic field, the magnetization of the storage layer 13 is not changed and, for example, if the information of "1" is recorded, the information is retained as it is. In order to record the information of "1", the electric current is supplied to a first wiring 22 corresponding to a target magnetic storage element 10. Here, the amount of the electric current to be supplied to the first wiring 22 is relatively large so as to heat the storage layer 13 to a temperature where the magnetic coupling with the pinned layer 15 works. Accordingly, the magnetic coupling works between the target magnetic storage element 10 and a magnetic storage element 10 corresponding to the same first wiring 22 so that the information "1" is recorded. In this situation, the information of "1" is recorded on all the magnetic storage elements corresponding to the same first wiring 22. Accordingly, information contents stored in the magnetic storage elements corresponding to the same first wiring 22 are read and stored in a different area (for example, in the other storage medium or a blank magnetic storage element in the same magnetic storage device) in advance, with regard to the magnetic storage element 10 on which the information of "0" was stored, in a step of stopping the electric current from the first wiring 22 and cooling the magnetic storage element 10, the electric current is supplied to the second wiring 23 corresponding to the element 10 to apply the current induced magnetic field to rewrite the information to be "0".

Here, in order to measure a temperature change of the magnetization state of the storage layer 13 in the magnetic storage element 10 of the present embodiment, only two layers of the first magnetic layer 11 and the second magnetic layer 12 constituting the storage layer 13 were formed and the temperature change of the magnetization was investigated. As the first magnetic layer 11, a CoFe film having a thickness of 2 nm was formed, and a Gd film having a thickness of 5 nm was formed as the second magnetic layer 12 on the CoFe film and the storage layer 13 was obtained. While applying a magnetic field of 1 kOe on the storage layer 13, the magnetization change of the whole storage layer 13 was measured while changing the temperature.

Figure 6:
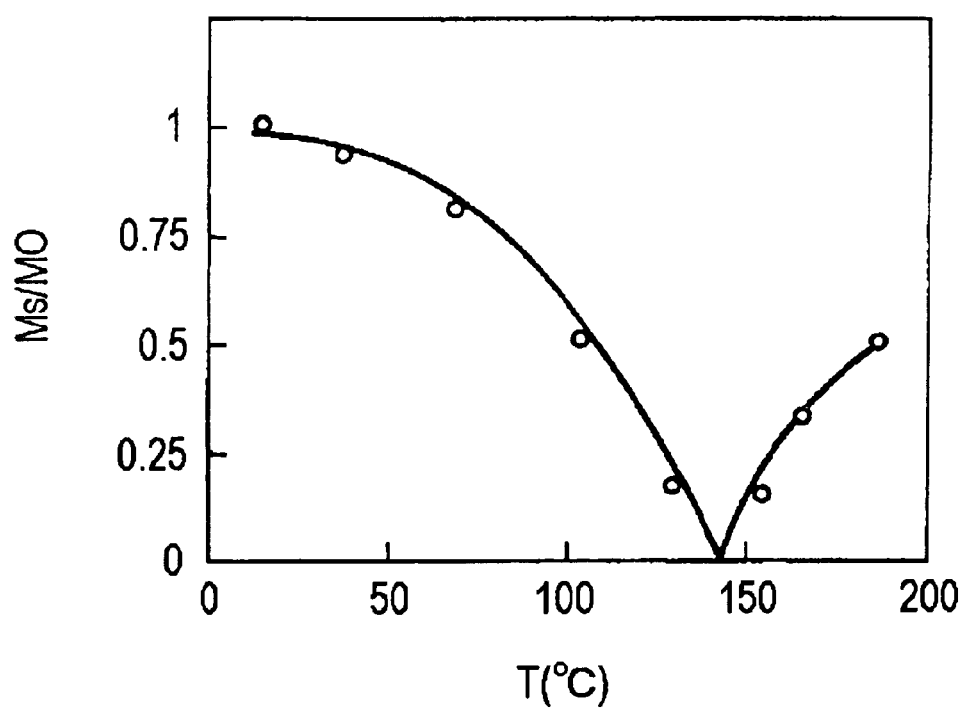
FIG. 6 is a graph showing ratio of an amount of magnetization of the storage layer at the room temperature and at other temperatures.

The measurement result is shown in FIG. 6. The FIG. 6 shows the change of a ratio (Ms/M0) of a magnetization magnitude Ms based on the magnetization amount M0 at the room temperature by the temperature with regard to the whole magnetization of the storage layer 13. It is confirmed that the magnetization amount Ms decreases as the temperature rises, and the magnetization amount Ms becomes minimum, almost zero (0), at around 140° C. That is, the magnetization M1 of the first magnetic layer (CoFe film) 11 and the magnetization M2 of the second magnetic layer (Gd film) 12, which are arranged to be in anti-parallel, become equal at the temperature.

Furthermore, in the magnetic tunnel junction element 16 of the structure shown in FIG. 2, relationship between the size of a magnetic field H and a tunnel resistance R was investigated. After having formed the stacked structure of the magnetic tunnel junction element 16 of the structure shown in FIG. 2, the element 16 is processed to be an oval with a major axis of 2 µm and a minor axis of 1 µm and the magnetic field H is applied in the major axis direction of the element 16. The strength of the magnetic field H and the tunnel resistance R of the tunnel current flowing through the tunnel insulation film 14 was measured. The measurement was carried out on the magnetic tunnel junction element 16 heated to the room temperature, at 125° C. and 175° C., respectively.

Figure 7A:
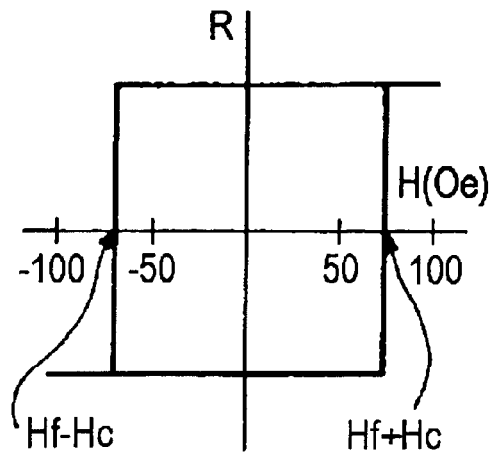
FIG. 7A is a measurement result at a room temperature.
Figure 7B:
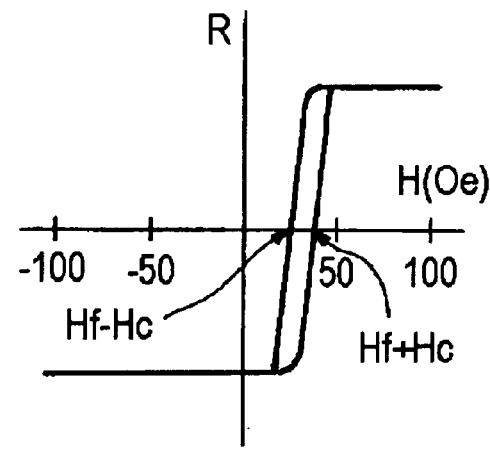
FIG. 7B is a measurement result at 125° C.
Figure 7C:
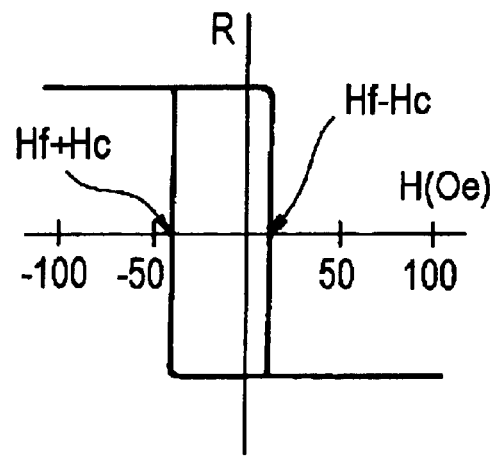
FIG. 7C is a measurement result at 175° C.

The measurement results are shown in FIG. 7A to FIG. 7C. FIG. 7A shows a result of the room temperature, FIG. 7B shows a result of 125° C. and FIG. 7C shows a result of 175° C. It is noted that in FIG. 7A to FIG. 7C, the magnetic field H is positive when its direction is the same as that of the magnetization of the pinned layer 15, and negative when its direction is an opposed direction.

Figure 8:
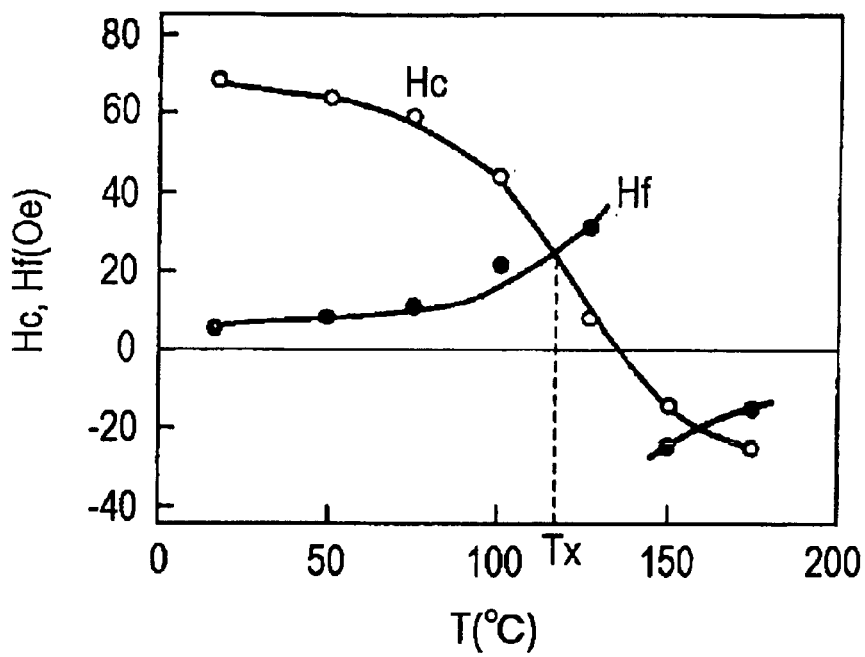
FIG. 8 is a graph showing values of Hf and Hc at each temperature in the magnetic tunnel junction element of FIG. 2.

Here, in each of FIG. 7A to FIG. 7C, during the steps of changing from a state where the resistance value is large to a state where it is small, a value of the magnetic field H at the time the resistance R becomes an average of the maximum value and the minimum value is "Hf−Hc", and during the steps of changing from a state where the resistance value is small to a state where it is large, a value of the magnetic field H at the time the resistance R becomes an average of the maximum value and the minimum value is "Hf+Hc". Similar measurements were carried out at the other temperatures, and FIG. 8 shows the values of Hf and Hc at respective temperatures. The value Hc becomes zero (0) at around 140° C. and there it changes from positive to negative. Although the value Hf is also positive at around 140° C. or lower and negative over the temperature, an absolute value of Hf is large around 140° C.

Here, in a temperature range where the absolute value of Hf is larger than an absolute value of Hc (|HF|>|Hc|) (around 115° C. to 160° C.), similar to the state of 125° C. shown in FIG. 7B, the magnetization becomes stable in a state that the resistance value is small when the magnetic field H does not exist (that is, H=0). In the magnetic tunnel joint element 16 of the structure shown in FIG. 2, similarly to a usual magnetic tunnel joint element, the tunnel resistance value R becomes small when the directions of the magnetization M3 of the pinned layer 15 and the magnetization M1 of the first magnetic layer (transition metal) 11 being in contact with the tunnel insulation film 14 are the same (in parallel), and the tunnel resistance value R becomes large when they are in opposed directions (in anti-parallel).

In other words, it is shown that, in the temperature range of 115° C. to 160° C., the tunnel resistance value R is small, that is the directions of the magnetization M1 of the first magnetic layer (transition metal) 11 and the magnetization M3 of the pinned layer 15 of the storage layer 13 are the same (in parallel) without applying the magnetic field H. That is, if the storage layer 13 is heated to the temperature and then cooled, as described above, the direction of the magnetization M of the whole storage layer 13 can be made anti-parallel to that of the magnetization M3 of the pinned layer 15 even without applying the magnetic field.

On the other hand, in order to make the direction of the magnetization M of the whole storage layer 13 in the reverse direction, as described above, the magnetic field H is applied in a condition that the storage layer 13 is heated to an extent it is still affected by the magnetic field H. The extent that it is still affected by the magnetic field H means a temperature range which almost satisfies |Hc|>|Hf| in FIG. 8. At this time, in view of FIG. 7A, the storage layer 13 may be applied with a magnetic field H of or over "Hf+Hc". Heating the storage layer 13 makes the value of "Hf+Hc" smaller than that at the room temperature so that the magnetic field H required for recording becomes smaller.

Figure 10A:
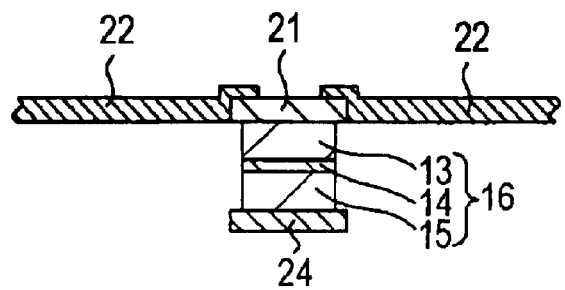
FIG. 10A and FIG. 10B are schematic cross sectional views of a magnetic storage element in which an electric current is made directly flow through a storage layer to apply a current induced magnetic field.
Figure 10B:
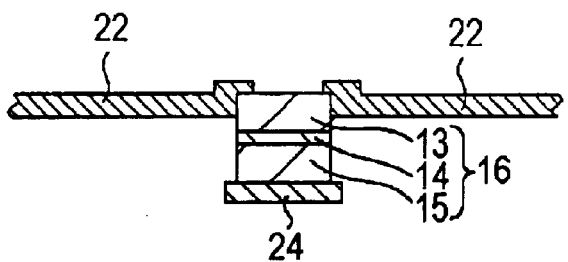

By the way, in order to further reduce the recording electric current, there may be a case where the magnetic field H to be applied to the storage layer 13 needs to be further smaller. Therefore, it is arranged that the electric current is supplied to the storage layer 13 to change the magnetization state of the storage layer 13 by the current induced magnetic field generated from the electric current. According to the structure, since the current induced magnetic field works on each of the first magnetic layer 11 and the second magnetic layer 12, even without a larger current induced magnetic field, and even if the magnetization (apparent magnetization) M of the whole storage layer 13 becomes small owing to the temperature rise, the magnetic field can work effectively on the magnetic layers 11 and 12 of the storage layer 13. When changing the magnetization state of the storage layer 13 using the current induced magnetic field generated from the electric current supplied to the storage layer 13, in order to generate a current induced magnetic field in a direction of an easy axis of magnetization of the storage layer 13, it is necessary to make the electric current flow in a direction of a hard axis of magnetization of the storage layer 13. Therefore, different from the resistance heater 21 and the first wiring 22 of FIG. 1, the resistance heater 21 and the wiring for supplying the electric current are disposed in the direction of the hard axis of magnetization of the storage layer 13. For example, a schematic cross sectional view of the magnetic storage element in a case of disposing the resistance heater 21 in the direction of the minor axis (the hard axis of magnetization) of the storage layer 13 is shown in FIG. 10A, and a schematic cross sectional view of the magnetic storage element in a case of disposing the wiring 22 connected directly to the storage layer 13 in the direction of the minor axis (the hard axis of magnetization) of the storage layer 13 is shown in FIG. 10B.

Figure 9:
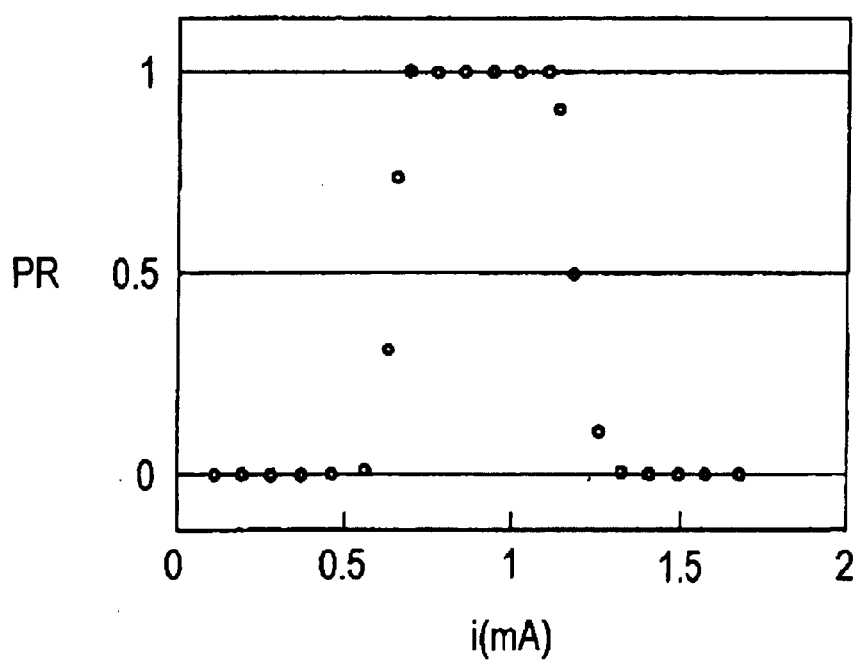
FIG. 9 is a view showing a measurement result of an inversion probability of the magnetization with regard to a pulse current value when a pulse current is applied to the magnetic tunnel junction element of FIG. 2.

In this way, change of the magnetization at the time the current induced magnetic field is applied by supplying the electric current directly to the storage layer 13 was investigated. In the magnetic tunnel junction element 16 having the structure of FIG. 2, an electrode is attached to an end of the direction of the minor axis of the storage layer 13 so that the electric current can flow through the storage layer 13. The magnetization M of the whole storage layer 13 was initialized to have a direction opposed to that of the magnetization M3 of the pinned layer 15 by an external magnetic field in advance (similar to the state shown in FIG. 4C). Next, after supplying a pulse current by which a current induced magnetic field opposed to the direction of the magnetization M3 of the pinned layer 15 to the first magnetic layer 11, whether or not the magnetization was inverted (the similar state as shown in FIG. 4A) was confirmed using the tunnel resistance R. The measurement was carried out by setting the pulse width (time) of the pulse current to be the same and changing the electric current values respectively. As the measurement result, probability of magnetization inversion PR with regard to the pulse current value i is shown in FIG. 9. The probability of magnetization inversion PR shows the probability of inversion by measuring 10 pieces of elements by ten times respectively.

As seen from FIG. 9, an assured magnetization inversion can be investigated in a range of about 0.7 to 1.1 mA of the pulse current value i. It is noted that the magnetization is not inverted when the pulse current value i is 1.3 mA or more. This is because the electric current value i is large and the temperature of the element further rises so that the above mentioned condition of |Hc|<|Hf|. Accordingly, the directions of the magnetization M1 of the first magnetic layer (transition metal layer) 11 and the magnetization M3 of the pinned layer 15 in the storage layer 13 becomes the same (the same state as shown in FIG. 4B), and after heated by the pulse current and cooled down to the room temperature, the directions of the magnetization M of the whole storage layer 13 and the magnetization M3 of the pinned layer 15 become opposed (the same state as shown in FIG. 4C). Thus, as a result, it seems to have no change from the initial state.

It should be noted that in a magnetic storage device such as an MRAM, in order to integrate the magnetic storage elements at high density, it is necessary to select a magnetic storage element at an arbitrary intersection of the wirings formed in a matrix pattern orthogonally crossing and to change the magnetization state thereof. Accordingly, even if the direction of the electric current flowing through the wiring 22 set only in one direction, it becomes possible to record information in accordance with the electric current value.

It should be noted that in a magnetic storage device such as an MRAM, in order to integrate the magnetic storage elements at high density, it is necessary to select a magnetic storage element at an arbitrary intersection of the wirings formed in a matrix pattern orthogonally crossing and to change the magnetization state thereof. However, in a case where the magnetic storage element having a structure as shown in FIG. 10A or FIG. 10B is employed, if it is intended to select an arbitrary magnetic storage element for recording only by supplying the electric current to the wiring 22, it is required to drive respective wirings 22 of the magnetic storage element separately so that it results in a complicated drive circuit which is not preferable.

Thus, tin order to easily select the magnetic storage element disposed in a matrix pattern, in addition to the wiring for supplying the electric current to the storage layer, there may be provided a wiring for heating the storage layer. An embodiment of the magnetic storage element structured in this way is shown in described in the following.

Figure 11A:
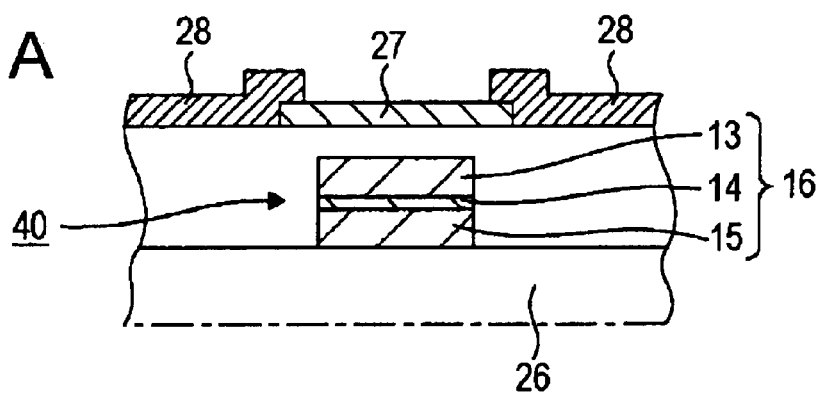
FIG. 11A is a cross sectional view of the magnetic storage element in a major axis direction (direction of an easy axis of magnetization) and FIG. 11B is a cross sectional view of the magnetic storage element in a minor axis direction (direction of a hard axis of magnetization).
Figure 11B:
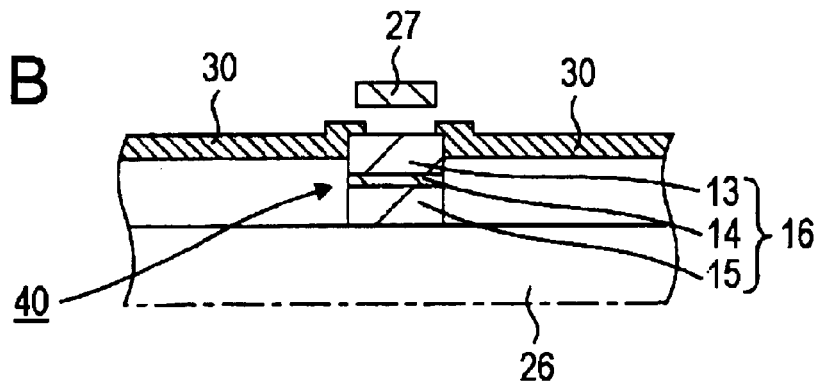

As another embodiment of the magnetic storage element of the present invention, a structure of the magnetic storage element using a plurality of wirings as a heater is shown in FIG. 11. FIG. 11A shows a cross sectional view of a major axis direction (that is, a direction of an easy axis of magnetization) of the magnetic storage element, and FIG. 11B shows a cross sectional view of a minor axis direction (that is, a direction of a hard axis of magnetization). In the present embodiment, also, the structure of the magnetic tunnel junction element 16 including the storage layer 13 is similar to that of the magnetic storage element 10 as shown in FIG. 1 before. In a magnetic storage element 40 of the present embodiment, a wiring 30 for supplying the electric current to a minor axis direction (a direction of a hard axis of magnetization) of a rectangular-formed storage layer 13 is directly connected thereto. In addition, a resistance heater 27 for heating the storage layer 13 is disposed above the storage layer 13 having a slight distance therebetween and in parallel with a major axis direction (a direction of an easy axis of magnetization) of the storage layer 13. A wiring 28 is connected to the resistance heater 27, and the electric current flows through the wiring 28 to the resistance heater 27 to heat it. In the figure, a reference numeral 26 shows a semiconductor substrate on which circuits such as a transistor are mounted.

In the magnetic storage element 40 of the present embodiment, since the resistance heater 27 does not come in contact with the storage layer 13 and formed with the slight distance therebetween, the storage layer 13 is little affected by the magnetic field from the resistance heater 27. Therefore, the resistance heater 27 does not function as magnetic field applying means, but functions exclusively as a heater. On the other hand, since a wiring 30 is directly connected to the storage layer 13, when the electric current is supplied to the wiring 30, the storage layer 13 can be heated by the electric current and a magnetic field corresponding to the direction of the electric current can be applied to each of the magnetic layers 11 and 12 of the storage layer 13. That is, the wiring 30 functions as a heater as well as magnetic field applying means.

A magnetic storage device can be constructed by arranging the magnetic storage element 40 vertically and horizontally to be a matrix pattern, and bonding the wiring 28 for resistance heating and the wiring 30 for supplying the electric current to the storage layer 13 at the magnetic storage elements 40 positioned on the same line or the same row thereof. Accordingly, the magnetic storage device capable of easily selecting the magnetic storage element 40 at an intersection of two wirings 28 and 30 can be constituted.

Next, a method for recording information on the magnetic storage element 40 of the present embodiment will be described with reference to FIG. 11 and FIG. 12. Here, in a state that the magnetization of the whole storage layer 13 is in the same direction as that of the magnetization of the pinned layer 15, information of "0" is recorded, and in a opposed state, information of "1" is recorded. The direction of the electric current supplying to the storage layer 13 from the wiring 30 is set to a direction applying the current induced magnetic field in the direction opposed to the magnetization of the pinned layer 15.

Figure 12A:
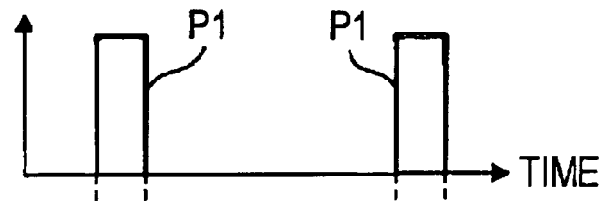
FIG. 12A and FIG. 12B are drawings for explaining methods of recording different information into the magnetic storage elements shown in FIG. 11.
Figure 12B:
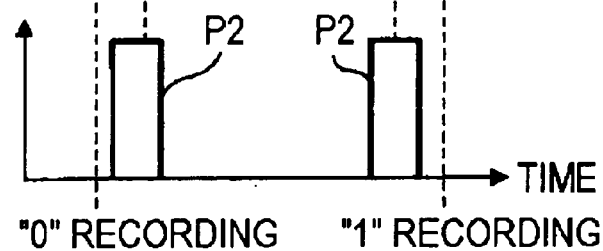

First, as shown on the left side of FIG. 12, in a case where a pulse current P1 is supplied to the resistance heater 27 before a pulse current P2 to be supplied to the storage layer 13, the electric current flows through the resistance heater 27 by the pulse current P1 and heating by the resistance heater 27 is first carried out. Then, heating and application of a magnetic field are carried out by the pulse current P2. Since the temperature of the storage layer 13 rises owing to the heating by the resistance heater 27 by the pulse current 1 and, in a state once heated, the magnetic field is applied, influence of the magnetic field to the storage layer becomes small owing to the temperature rise, and the first magnetic layer 11 and the pinned layer 15 are once magnetically coupled so that the directions of the magnetization of the first magnetic layer 11 and the magnetization of the pinned layer 15 become parallel. Thereafter, the electric current of the pulse current P1 runs out first and in that state there is still the pulse current P2, at the time when the temperature lowers, the current induced magnetic field by the electric current from the wiring 30 is applied. Accordingly, the direction of the magnetization of the first magnetic layer (transition metal layer) 11 becomes opposed to that of the current induced magnetic field, that is, the magnetization of the pinned layer 15, and further, when being cooled down to the room temperature, the magnetization of the second magnetic layer 12 which opposes to the magnetization of the first magnetic layer 11 becomes strong so that the direction of the magnetization of the whole storage layer 13 becomes the same as that of the magnetization of the pinned layer 15. In this way, the information "0" is recorded.

On the other hand, as shown in the right side of FIG. 12, in a case where the pulse current P1 is supplied to the resistance heater 27 after the pulse current P2 to be supplied to the storage layer 13, heating and application of the magnetic field are carried out with the pulse current P2 and, then, heating with the pulse current P1 is carried out. Since the temperature of the storage layer 13 rises owing to the heating with the pulse current P2 and further with the pulse current P1, influence of the magnetic field to the storage layer 13 becomes small owing to the temperature rise, and the first magnetic layer 11 and the pinned layer 15 are magnetically coupled so that the directions of the magnetization of the first magnetic layer 11 and the magnetization of the pinned layer 15 become parallel. Thereafter, the electric current of the pulse current P2 runs out first and in that state there is still the pulse current P1, at the time when the temperature lowers, the current induced magnetic field by the electric current from the wiring 30 is not applied. Accordingly, the direction of the magnetization of the first magnetic layer (transition metal layer) 11 is still the same (parallel) to that of the magnetization of the pinned layer 15, and further, when being cooled down to the room temperature, the magnetization of the second magnetic layer 12 which opposes to the magnetization of the first magnetic layer 11 becomes strong so that the direction of the magnetization of the whole storage layer 13 becomes opposed to that of the magnetization of the pinned layer 15. In this way, the information "1" is recorded.

Therefore, by shifting the timing of the two pulse currents P1 and P2, in correspondence with the sequential order of the pulse currents P1 and P2, the direction of the magnetization of the storage layer 13 can be changed and, as a result, information of "0" or "1" can be recorded.

According to the magnetic storage element 40 of the present embodiment, the magnetization state of the storage layer 13 can be changed using only the electric current having one direction to be supplied to the wiring 30. Accordingly, in comparative of a case of supplying the electric current in both directions to the wiring 30, the number of combinations of electrical potential to be supplied to the both ends of the wiring can be reduced. For example, it is only necessary to set one to be high potential or the both to be the same potential, and it is not required to set one to be low potential and the other to be high potential. Therefore, when a large number of magnetic storage elements 40 are integrated to have a magnetic storage device, the drive circuit for supplying the electric current to the wiring can be simplified and it is easy to integrate the elements at high density.

By supplying the electric current from the wiring 30 directly to the storage layer 13 to apply the current induced magnetic field, the current induced magnetic field effectively works on the storage layer 13. Accordingly, in comparative of a case of applying the current induced magnetic field from the wiring 23 which is away from the storage layer 13 as shown in FIG. 1, recording with less recording current is made possible. Since the storage layer 13 can be heated to have the higher temperature with the electric current flowing from the wiring 30 to the storage layer 13, the current induced magnetic field can be applied in a state that the coercive force of the storage layer 13 is smaller than that at the room temperature, and the current induced magnetic field required for recoding can be smaller. From this viewpoint, recording with smaller recording electric current is made possible.

Furthermore, since the storage layer 13 is heated by supplying the electric current from the wiring 30 directly to the storage layer 13 and also by supplying the electric current from the wiring 28 to the resistance heater 27, it is possible to select and record on a magnetic storage element at an arbitrary position among a number of magnetic storage elements arranged in a matrix pattern.

In the above embodiment, information recording is performed by changing the pulse currents P1 and P2 to be supplied to the two wirings 28 and 30 by shifting their timing. However, it is also possible to carry out recording in another method. A specific embodiment thereof will be described below.

Figure 13:
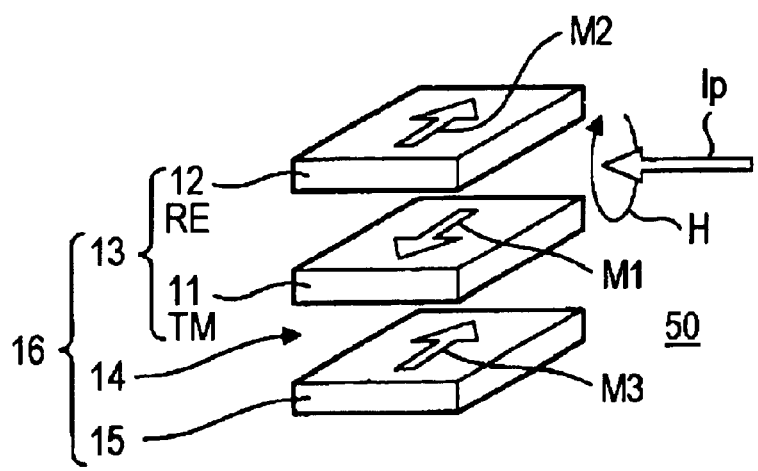
FIG. 13 is a schematic structural view showing a magnetic storage element according to still another embodiment of the present invention.

A schematic structural view showing a magnetic storage element according to still another embodiment of the present invention is shown in FIG. 13. As shown in FIG. 13, a pulse current Ip is supplied to the storage layer 13 which comprises the first magnetic layer 11 and the second magnetic layer 12 in a magnetic storage element 50, and, using the current induced magnetic field H generated from the pulse current Ip, a magnetic field is applied to the storage layer 13. A direction of the pulse current Ip is set so that the current induced magnetic field H works in a direction opposed to the magnetization M3 of the pinned layer 15 with regard to the first magnetic layer (transition metal layer) of the storage layer 13. In order to supply the pulse current Ip to the storage layer 13 in this way, similarly to the wiring 30 of FIG. 11B, the wiring may be connected directly to the minor axis direction (direction of the hard axis of magnetization) of the storage layer 13 so that the pulse current Ip flows from the drive circuit to the wiring. Since, in the case where the current induced magnetic field is applied by supplying the electric current directly from the wiring to the storage layer 13, the current induced magnetic field is applied in a condition that the coercive force of the storage layer 13 becomes small owing to the temperature rise by heating with the electric current.

Figure 14:
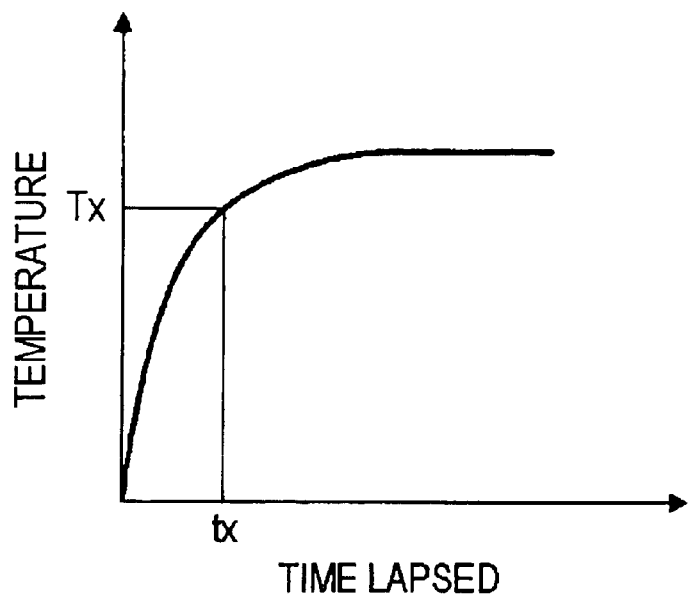
FIG. 14 is a graph showing relationship between the time lapsed and a temperature of the storage layer when the wiring directly connected to the storage layer to make the current flow therethrough.
Figure 15:
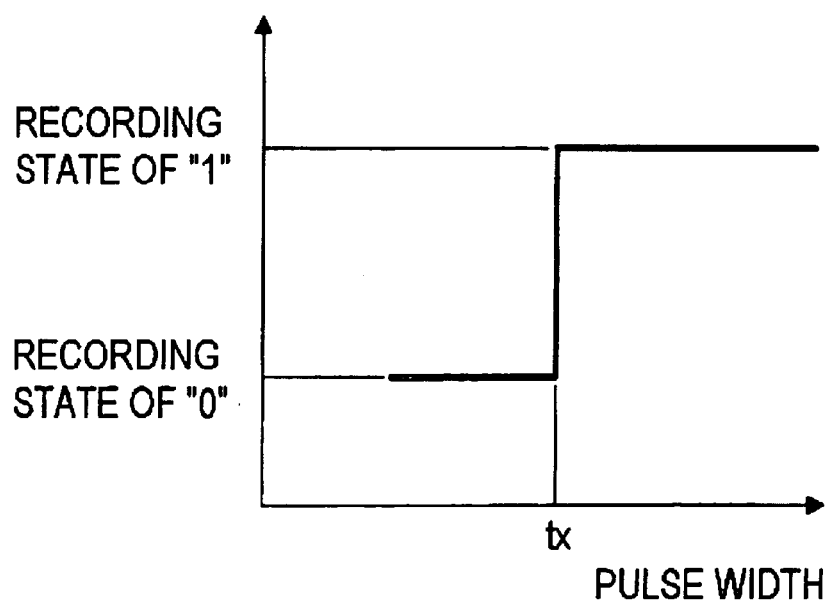
FIG. 15 is a figure explaining a method to record information on a magnetic storage element of FIG. 14.

Relationship between the temperature of the storage layer 13 and Hc, Hf has a tendency as shown in FIG. 8 before. As the temperature rises, Hc decreases and Hf increases, and when the temperature reaches a certain temperature Tx, Hf becomes larger than Hc. When the wiring is directly connected to the storage layer 13 and the electric current is supplied thereto, as shown in FIG. 14, after a lapse of a certain time $t_x$, the temperature reaches Tx where Hf>Hc is satisfied, and thereafter, the temperature rise slows down and is saturated at a certain temperature.

In the magnetic storage element 50 of the present embodiment, using the change shown in FIG. 14, by making the pulse width of the pulse current Ip longer than or shorter than the time $t_x$, information recording is carried out in the following way.

Here, in a state that the magnetization of the whole storage layer 13 is in the same direction as that of the magnetization of the pinned layer 15, information of "0" is recorded, and in a opposed state, information of "1" is recorded. At first, when the pulse width of the pulse current Ip is made shorter than the time $t_x$, the temperature of the storage layer 13 only reaches under the temperature Tx, and the current induced magnetic field H with the pulse current Ip is applied to the storage layer 13 in that state. Accordingly, the direction of the magnetization M1 of the first magnetic layer 11 becomes anti-parallel with the direction of the magnetization M3 of the pinned layer 15 in accordance with the influence of the current induced magnetic field H. And when the pulse current Ip finishes and the storage layer 13 is cooled down to the room temperature, the magnetization M2 of the second magnetic layer 12 opposing to the magnetization M1 of the first magnetic layer 11 becomes strong so that the direction of the magnetization M of the whole storage layer 13 becomes the same as that of the magnetization M3 of the pinned layer 15. In this way, the information "0" is recorded.

On the other hand, when the pulse width of the pulse current Ip is made longer than the time $t_x$, the temperature of the storage layer 13 reaches the temperature Tx or over, and the current induced magnetic field H with the pulse current Ip is applied to the storage layer 13 in that state. Accordingly, since the magnetic coupling with the magnetization M3 of the pinned layer 15 becomes stronger than the influence of the current induced magnetic field H, the direction of the magnetization M1 of the first magnetic layer 11 becomes parallel to that of the magnetization M3 of the pinned layer 15. And when the pulse current Ip finishes and the storage layer 13 is cooled down to the room temperature, the magnetization M2 of the second magnetic layer 12 opposing to the magnetization M1 of the first magnetic layer 11 becomes strong so that the direction of the magnetization M of the whole storage layer 13 becomes anti-parallel with that of the magnetization M3 of the pinned layer 15. In this way, the information "1" is recorded.

Therefore, by making the pulse width (time) of the two pulse current Ip longer than or shorter than $t_x$, the direction of the magnetization of storage layer 13 can be changed and, as a result, information of "0" or "1" can be recorded.

According to the magnetic storage element of the present embodiment, similarly to the above-mentioned embodiment, the magnetization state of the storage layer 13 can be changed using only the electric current Ip having one direction. Accordingly, the number of combinations of potentials to be supplied to the both ends of the wiring to make the current Ip flow therethrough can be reduced in comparative of a case of flowing the electric current in both directions of the wiring. Therefore, when a number of magnetic storage elements 50 are integrated to have a magnetic storage device, the drive circuit can be simplified and it is easy to integrate the elements at high density.

Even in the magnetic storage element of the present invention, if it is arranged that the electric current is supplied from the wiring directly connected to the storage layer 13 to heat the storage layer 13, and, similarly to FIG. 11A, the electric current is supplied to the other wiring orthogonally crossing with the wiring to heat the storage layer 13, it is possible to selectively record information on a magnetic storage element at an arbitrary position among a number of magnetic storage elements positioned in a matrix pattern by selecting the wiring to which the electric current is to be supplied from respective plurality of two kinds of wirings orthogonally crossing.

It is noted that in the magnetic storage element of each of the above embodiments, instead of the tunnel insulation film 14, a non-magnetic conductor layer such as a Cu layer may be used between the storage layer 13 and the pinned layer 15 to constitute a giant magnetoresistive effective element (GMR element) so that it is possible to read a relative magnetization of the storage layer 13 and the pinned layer 15 on the basis of the giant magnetic resistive effect of the GMR element. The magnetic tunnel junction element 16 using the tunnel insulation film 14 has a large resistance change rate and can detect the magnetization so that it is effectively advantageous for simplifying the magnetic storage element and the magnetic storage device.

The present invention is by no means limited to the above-described embodiments, and other various configurations are allowable without departing from the essential spirit of the present invention.

What is claimed is:

1. A magnetic storage element, comprising:
   a storage layer for holding a magnetization state as information, a non-magnetic layer and a pinned layer in which a direction of the magnetization is fixed, which are stacked, wherein:
   said storage layer is composed of a first magnetic layer mainly composed of a transition metal and a second magnetic layer mainly composed of a rare-earth metal which are directly stacked, and
   a magnetization amount of said first magnetic layer is smaller than that of said second magnetic layer at a room temperature.

2. The magnetic storage element as claimed in claim 1, wherein said first magnetic layer among said first and second magnetic layers constituting said storage layer is disposed closer to said pinned layer.

3. A recording method on a magnetic storage element, using a magnetic storage element comprising: a storage layer for holding a magnetization state as information, a non-magnetic layer and a pinned layer in which a direction of the magnetization is fixed, which are stacked, wherein: said storage layer is composed of a first magnetic layer mainly composed of a transition metal and a second magnetic layer mainly composed of a rare-earth metal which are directly stacked, and a magnetization amount of said first magnetic layer is smaller than that of said second magnetic layer at a room temperature, said method comprising the steps of:
   heating said storage layer and applying a magnetic layer to the storage layer to record a magnetization state having one direction on the storage layer, and
   heating said storage layer to have a magnetic coupling work on said first magnetic layer and said pinned layer so as to record a magnetization state having the other direction on the storage layer.

4. A magnetic storage device comprising:
   a magnetic storage element comprising a storage layer for holding a magnetization state as information, a non-magnetic layer and a pinned layer in which a direction of the magnetization is fixed, which are stacked, said storage layer is composed of a first magnetic layer mainly composed of a transition metal and a second magnetic layer mainly composed of a rare-earth metal which are directly stacked; in which a magnetization amount of said first magnetic layer is smaller than that of said second magnetic layer at a room temperature;
   a reader for reading out a relative magnetization between said storage layer and said pinned layer depending on a change of an electrical resistance;
   a wiring for applying a current induced magnetic field having one direction to said storage layer; and
   a heater for heating said storage layer.

5. The magnetic storage device as claimed in claim 4, wherein: said wiring is electrically connected to said storage layer and also serves as said heater.

6. The magnetic storage device as claimed in claim 5, wherein: a second wiring is provided to said magnetic storage element in addition to said wiring, and said heater comprises the wiring and the second wiring.

* * * * *